(12) United States Patent
Motomura et al.

(10) Patent No.: US 6,263,413 B1
(45) Date of Patent: Jul. 17, 2001

(54) MEMORY INTEGRATED CIRCUIT AND MAIN MEMORY AND GRAPHICS MEMORY SYSTEMS APPLYING THE ABOVE

(75) Inventors: Masato Motomura; Yoshikazu Yabe; Yoshiharu Aimoto, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/066,605

(22) Filed: Apr. 27, 1998

(30) Foreign Application Priority Data

Apr. 30, 1997 (JP) .................................... 9-111682

(51) Int. Cl.⁷ ................................................. G06F 12/02
(52) U.S. Cl. ............................................ 711/173; 709/247
(58) Field of Search ............................ 709/247; 711/101, 711/104, 105, 154, 173

(56) References Cited

U.S. PATENT DOCUMENTS

| | | | |
|---|---|---|---|
| 5,440,718 | * 8/1995 | Kumagai et al. | 711/154 |
| 5,611,024 | * 3/1997 | Campbell et al. | 358/1.15 |
| 5,974,471 | * 10/1999 | Belt | 710/1 |

FOREIGN PATENT DOCUMENTS

| | | |
|---|---|---|
| 63-85841 | 4/1988 | (JP) . |
| 2-86267 | 3/1990 | (JP) . |
| 2-178745 | 7/1990 | (JP) . |
| 4-82082 | 3/1992 | (JP) . |
| 4-49142 | 8/1992 | (JP) . |

OTHER PUBLICATIONS

Steven A. Przybylski et al., "New DRAM Technologies, A Comprehensive Analysis of the New Architectures", Second Edition, MicroDesign Resources, 1996, pp. 117–127 and 259–336.

Terry A. Welch, "A Technique for High–Performance Data Compression", Jun. 1984, pp. 8–19.

Yong Yao, "AGP Speeds 3D Graphics", MicroDesign Resources, Jun. 17, 1996, pp. 11–15.

* cited by examiner

Primary Examiner—Kevin L. Ellis
(74) Attorney, Agent, or Firm—Sughrue, Mion, Zinn Macpeak & Seas, PLLC

(57) ABSTRACT

A memory large scale integrated circuit with a data compression/decompression function, applicable to a main memory system, graphics memory system and such is provided with a data compression/decompression section. In this structure, compressed data-read with respect to a memory section is performed with an application of a data compressor within the compression/decompression section, and compressed data-write with respect to the memory section is performed with an application of a data decompressor within the compression/decompression section. Owing to this structure, even when a data bandwidth is physically the same as in the conventional case, it is practically possible to achieve a larger data bandwidth in use.

19 Claims, 8 Drawing Sheets

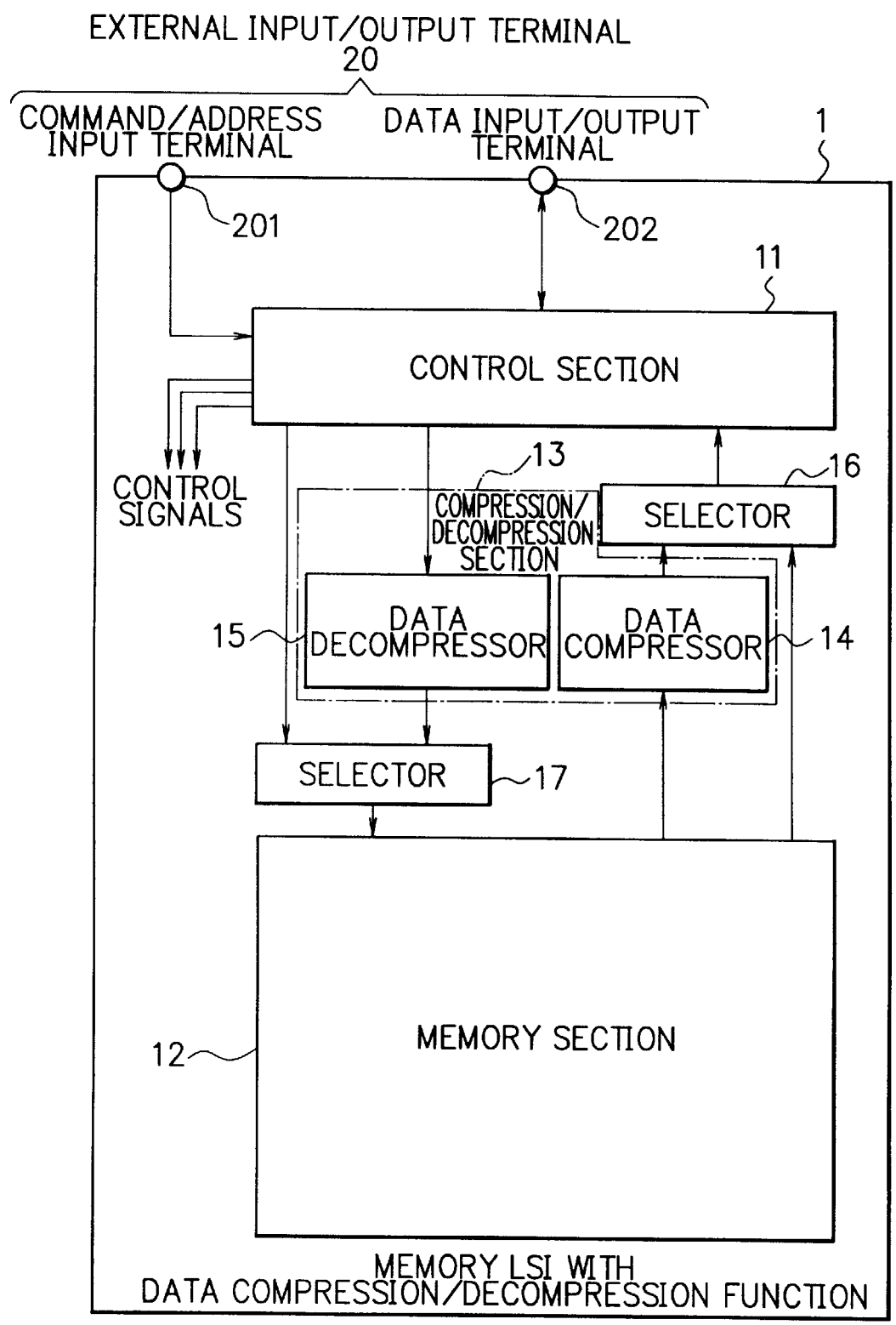

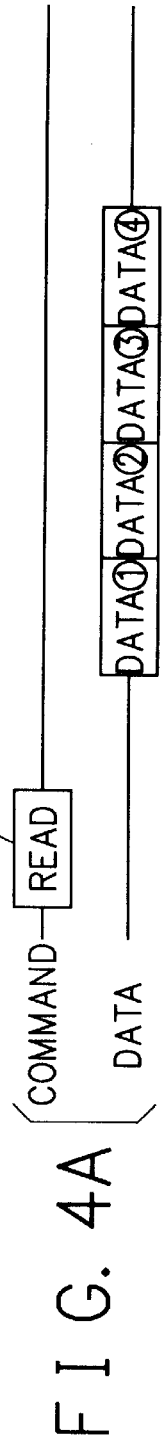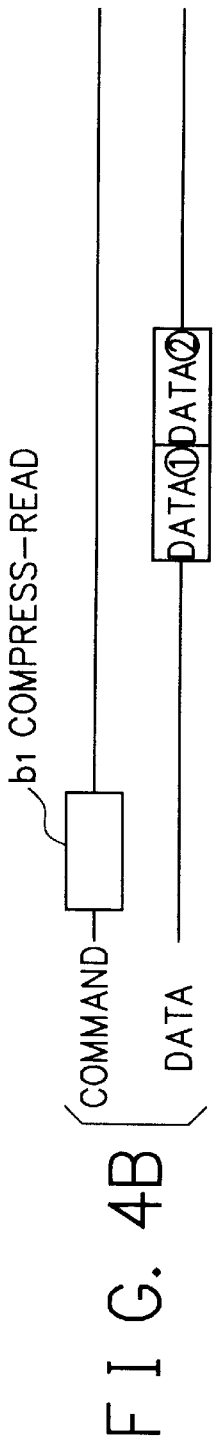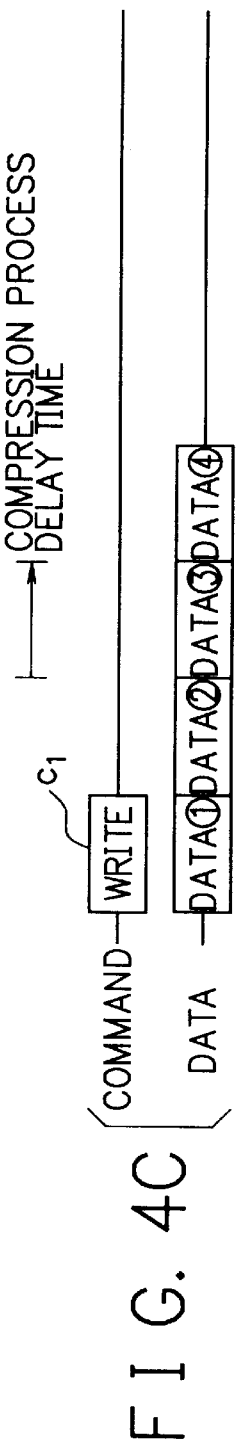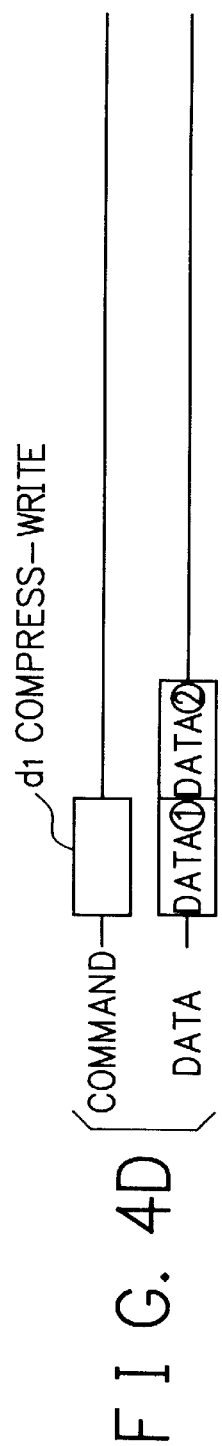

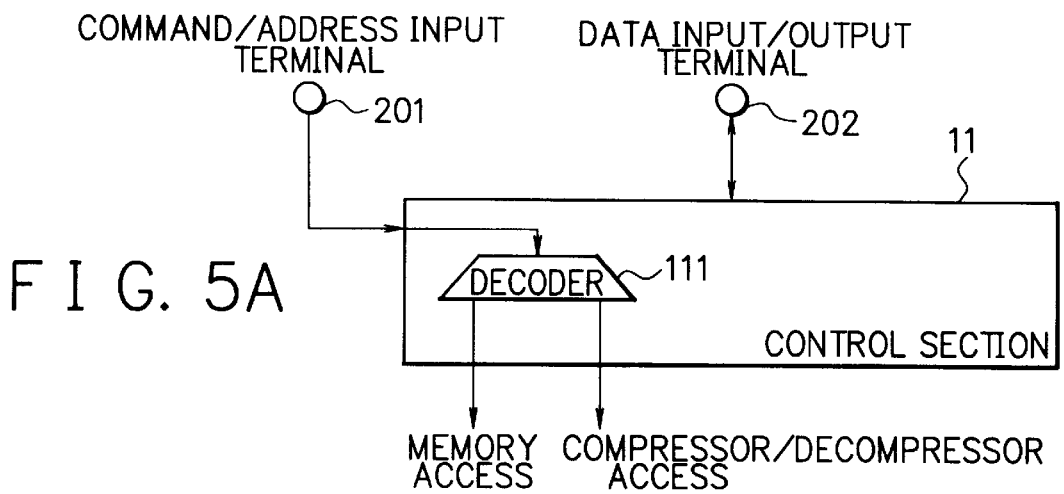
F I G. 5A
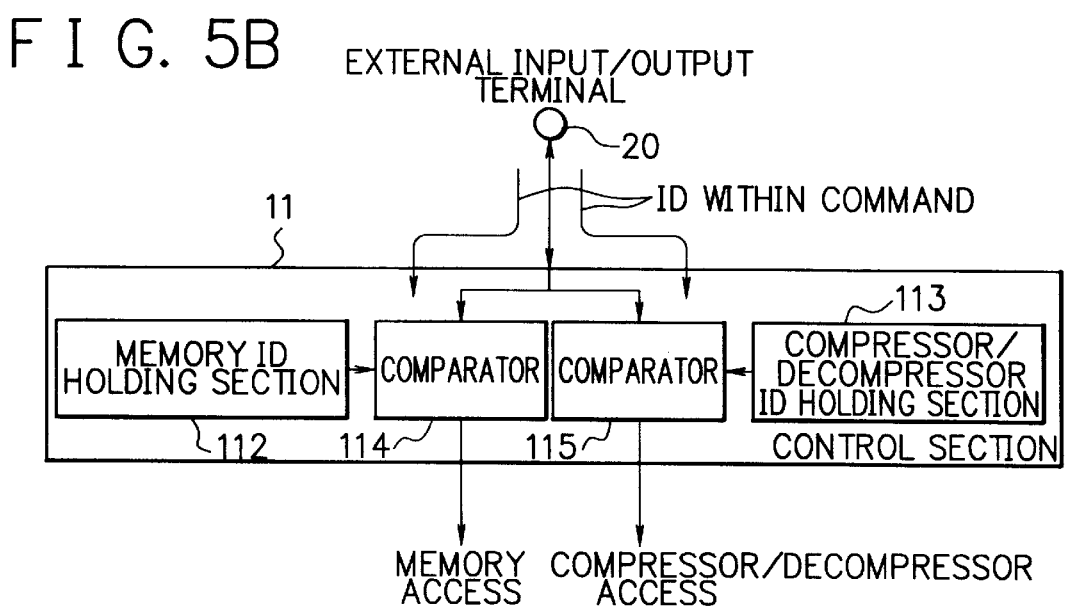
F I G. 5B
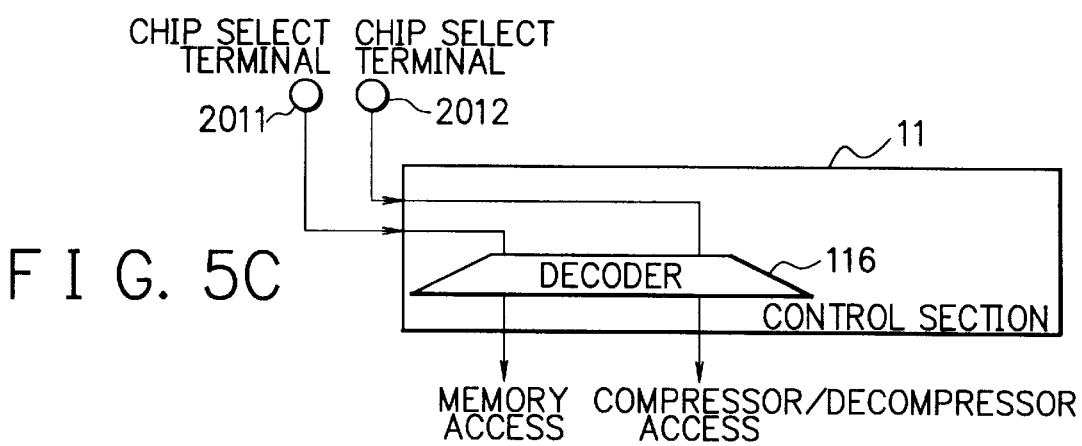
F I G. 5C

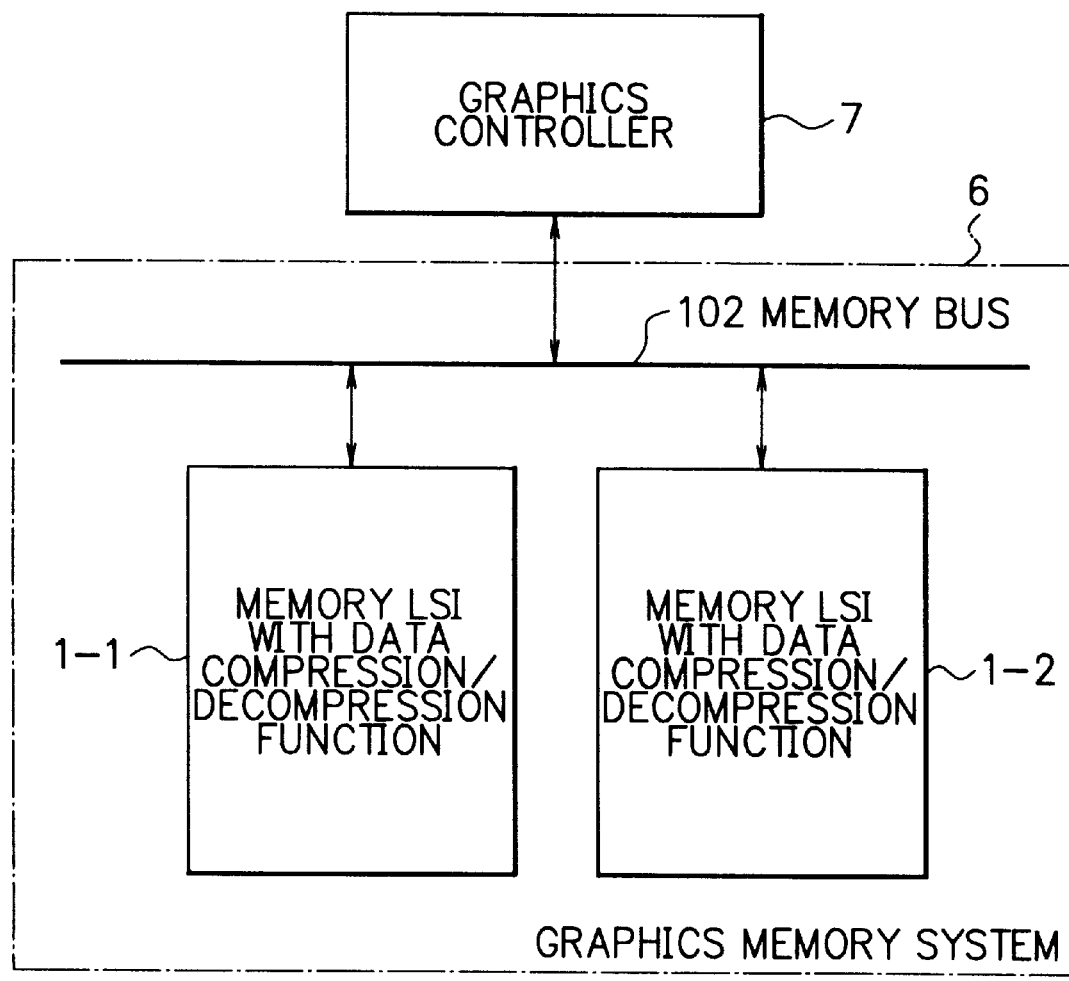

MEMORY INTEGRATED CIRCUIT AND MAIN MEMORY AND GRAPHICS MEMORY SYSTEMS APPLYING THE ABOVE

BACKGROUND OF THE INVENTION

The present invention relates to a memory integrated circuit with a data compression/decompression function, and a main memory system and a graphics memory system applying such memory integrated circuit. In particular, the present invention relates to a large-capacity semiconductor memory LSI (large scale integrated circuit) which could be represented by a dynamic random access memory (DRAM), and utilized in constructing a main memory system and graphics memory system within a computer system.

DESCRIPTION OF THE RELATED ART

With respect to a semiconductor memory LSI, it is regarded as typical that the larger the memory capacity is, the larger the data bandwidth should become in accessing to the memory contents. This is due to the fact that this large-capacity semiconductor memory LSI is normally applied to a high-performance computer system which requires a considerably large data bandwidth.

Therefore, in order to achieve a more convenient memory LSI for the computer system, it is extremely important that the memory capacity of the memory LSI and the data bandwidth are balanced. Accordingly, with respect to the DRAM being the memory LSI with the largest capacity, technical development has been sought with some enthusiasm in order to obtain an improved data bandwidth.

The most typical method for improving the data bandwidth of the memory LSI is a method of rising the operating frequency of the external interface. Currently, the highest bandwidth possible for the memory LSI is achieved by the Rambus technique, as the highest bandwidth is 600 Mbits/s per signal line with the application of both edges of a clock with 300 MHz. "Rambus" is the official trademark of Rambus Inc., US, and the mentioned Rambus technique is a technique proposed by Rambus Inc..

Technically, raising the operating frequency of the external interface to a higher value than the one just mentioned could be extremely difficult. One of the problems is a simultaneous operation of the external input/output signal terminals. When a large number of signal terminals are to operate simultaneously in high-speed, the chip will have to deal with larger consumption of power, and a large switching noise will be induced, causing a poor performance of the memory LSI.

Time discrepancies, i.e. skew, among signal lines could be a serious problem, too. For it is difficult to completely equalize the electrical parameters of the signal lines on the board, time discrepancies caused by inconsistency among electrical parameters must become an obstacle with respect to a high-speed operation of a GHz-level.

Generally, a main memory system of a computer would have a structure in which a plurality of DRAMs are connected to a memory bus. On the memory bus, however, disarray of signal waveforms inevitably occurs due to impedance mismatching etc., which could be another obstacle to the high-speed operation.

Consequently, it has become difficult to improve the data bandwidth by simply rising the operating frequency of the external interface according to the conventional technique. Moreover, as the memory LSI applying a high-speed interface and the memory system employing the memory LSIs are generally expensive, a proposal for achieving a high-bandwidth memory system with less memory LSIs by reducing the amount of data to be transferred with the application of a data compression method has come to a focus.

Conventionally, this type of technique has been used for transferring graphics data. This is based on the fact that graphics data is proved to be highly suitable for data compression, i.e. it has a high compression ratio because of its redundancy and consistency. Besides, in transferring graphics data, a large data bandwidth is required in both the graphics memory system and the main memory system.

The above technique is being proposed in "New DRAM Technologies—A Comprehensive Analysis of the New Architectures (Second Edition)" (Steven A. Przybylski, MicroDesign Resources, 1996, pp. 124–127).

The technique proposed in the above-mentioned paper will be described with reference to FIG. 1. A frame buffer 8 shown in the figure constituted by the memory LSI is a memory system used particularly for screen-write in the graphics memory system.

In this memory system, the frame buffer 8 is provided with an uncompressed write-data area 81 for the uncompressed write-data, and a compressed write-data area 82 for the compressed write-data. Each of those areas is arranged as a set of blocks in a particular region of the screen.

When a write transaction is to be taken with respect to a certain block, first, a graphics controller 9 is to check the compressed write-data corresponding to that particular block, i.e. the data in the compressed write-data area 82. When the compressed write-data is being marked as valid, the graphics controller 9 is to take the write transaction using the compressed write-data. On the other hand, when the compressed write-data is being marked as invalid, it will take the write transaction using the uncompressed write-data corresponding to the block, i.e. the data in the uncompressed write-data area 81.

In the latter case, when the graphics controller 9 identifies that the compressed write-data is invalid, the graphics controller 9 will compress the uncompressed write-data read out from the uncompressed write-data area 81 so as to write it on a corresponding block in the compressed write-data area 82. In this occasion, the compressed write-data written on the compressed write-data area 82 will be marked as valid.

When the graphics controller 9 is to rewrite the write-data, it will rewrite the data in the uncompressed write-data area 81. When this happens, the compressed data in the block of the compressed write-data area 82 which corresponds to the one being rewritten will be marked as invalid. This means that only the compressed version of the newly rewritten data will be marked as invalid.

With the application of the above process, it becomes possible to reduce the amount of data transmission needed for screen-write. It has not been mentioned in particular about the method of compression with respect to graphics data. However, this could be dealt with a provision of a graphics controller which performs data compression with software or hardware. Such compression method for data having redundancy and consistency is mentioned in "A technique for High-Performance Data Compression" (Terry A. Welch, IEEE Computer, June 1984, pp. 8–19). The extent of reduction on the amount of data transmission which could be obtained by this particular technique usually depends on a kind of compression method taken, and on the type of data used. Yet, it is generally expected that data transmission can be reduced to approximately a half to $\frac{1}{10}$.

According to the above-mentioned memory system of the conventional type using the data compression technique, it is possible to dramatically reduce the amount of data transmission with respect to data for screen-write, as compared with the case of not performing data compression. However, such a technique can induce certain problems which will be described below.

Some transactions requiring transferring of graphics data includes screen-write, reading of image data, screen-rewrite etc.. Especially when it comes to 3D graphics transactions, a larger amount of bandwidth as compared with the screen-write process is required for reading texture data, accessing to a Z-buffer, writing polygons (i.e. screen-rewrite) etc.. Texture data as a term is a data of patters for use as backgrounds and in covering stereoscopic surfaces, with respect to a graphics software. The Z-buffer is a buffer for holding data relating to the direction of Z-axis in a 3D graphics transaction.

For example, referring to a technique as mentioned in "AGP Speeds 3D Graphics" (Yong Yao, Microprocessor Report Vol. 10, No. 8, Jun. 17, 1996), bandwidth requirements for a screen with 1024×768 pixels will be as follows: 150 Mbytes/s for screen-write, 200 Mbytes/s for screen-rewrite, 200 Mbytes/s for Z-buffer access, and 250 Mbytes/s for reading texture data.

Since data compression here is limited to the case of screen-write only, data other than the one for screen-write can not be compressed. This is not satisfactory enough especially with respect to 3D graphics transactions which are expected to become a future mainstream of graphics transactions, while it requires minimized data traffic on the whole.

According to the conventional technique, write-data is once read out from the memory LSI that forms the frame buffer to the graphics controller LSI, after which it is compressed and written on the memory LSI. This means that there are some apparently unnecessary data transferring between the memory LSI and the graphics controller LSI.

Actually, where data-rewrite does not happen so often, most of the compressed write data remains valid, and hence compressed data-write as just mentioned will occur only occasionally. In such a case, the process taken is not by all means unnecessary. However, with respect to such applications which require a great deal of 3D graphics transactions, write-data might be rewritten quite often. In such a case, there are consequently more occasions in which the uncompressed write-data is read out, which leads to unnecessary writing of compressed write-data.

In addition, according to the conventional technique, the data can not be compressed unless it is once read out from the memory LSI to the outside. Generally, such a method is only appropriate for data having occasional rewrites for it is proved effective in accessing the same data over and over again.

This concludes that the conventional technique requires the subject data to be static in addition to being redundant and consistent. Because of such particular requirements, the conventional technique is not generally considered as an effective method for data compression.

SUMMARY OF THE INVENTION

It is therefore an object of the present invention to resolve all the problems mentioned, and to provide a memory integrated circuit capable of effectively expanding the data bandwidth and reducing the amount of data transmission with the application of an easily achievable method with higher reliability than the conventional high-speed operation technique. Moreover, it is another object of the present invention to provide a main memory system and a graphics memory system utilizing the above memory integrated circuit.

According to a first aspect of the present invention, there is provided a memory integrated circuit provided at least with an external input/output terminal for data input or output, a memory for storing data, a control means for controlling data-read and data-write with respect to the memory, a first transfer means for transferring data read out from the memory directly to the external input/output terminal at a time of data-read, a second transfer means for transferring data inputted from the external input/output terminal directly to the memory at a time of data-write, a compression means for compressing data read out from the memory so as to transfer the compressed data to the external input/output terminal at a time of compressed data-read, and a decompression means for decompressing the compressed data inputted from the external input/output terminal so as to transfer the decompressed data to the memory at a time of compressed data-write, all of which being included in the same chip.

According to a second aspect of the present invention, there is provided a main memory system including a memory integrated circuit and a memory chip: the memory integrated circuit provided at least with an external input/output terminal for data input or output, a memory for storing data, a control means for controlling data-read and data-write with respect to the memory, a first transfer means for transferring data read out from the memory directly to the external input/output terminal at a time of data-read, a second transfer means for transferring data inputted from the external input/output terminal directly to the memory at a time of data-write, a compression means for compressing data read out from the memory so as to transfer the compressed data to the external input/output terminal at a time of compressed data-read, and a decompression means for decompressing the compressed data inputted from the external input/output terminal so as to transfer the decompressed data to the memory at a time of compressed data-write, all of which being included in the same chip; and the memory chip storing at least a program.

According to a third aspect of the present invention, there is provided a main memory system including a memory integrated circuit and a memory chip: the memory integrated circuit storing graphics data and provided at least with an external input/output terminal for data input or output, a memory for storing data, a control means for controlling data-read and data-write with respect to the memory, a first transfer means for transferring data read out from the memory directly to the external input/output terminal at a time of data-read, a second transfer means for transferring data inputted from the external input/output terminal directly to the memory at a time of data-write, a compression means for compressing data read out from the memory so as to transfer the compressed data to the external input/output terminal at a time of compressed data-read, and a decompression means for decompressing the compressed data inputted from the external input/output terminal so as to transfer the decompressed data to the memory at a time of compressed data-write, all of which being included in the same chip; and the memory chip storing at least a program.

According to a fourth aspect of the present invention, there is provided a graphics memory system including a memory integrated circuit and a graphics controller: the memory integrated circuit storing graphics data and provided at least with an external input/output terminal for data input or output, a memory for storing data, a control means for controlling data-read and data-write with respect to the memory, a first transfer means for transferring data read out from the memory directly to the external input/output terminal at a time of data-read, a second transfer means for transferring data inputted from the external input/output terminal directly to the memory at a time of data-write, a compression means for compressing data read out from the memory so as to transfer the compressed data to the external input/output terminal at a time of compressed data-read, and a decompression means for decompressing the compressed data inputted from the external input/output terminal so as to transfer the decompressed data to the memory at a time of compressed data-write, all of which being included in the same chip; and the graphics controller transferring the graphics data between the memory integrated circuit and itself, performing at least compression and decompression transactions of the graphics data.

With respect to the above four aspects of the invention, the memory integrated circuit i.e. the memory LSI with a data compression/decompression function, comprises within its chip: an external input/output terminal for inputting and outputting data, a memory section for storing data, a control section for controlling data-read and data-write transactions, a compression/decompression section which comprises a data compressor and a data decompressor, the compression/decompression section capable of performing four access transactions including a read transaction, compress-read transaction, write transaction and compress-write transaction, with respect to data of an arbitrary position within the memory section.

In accordance with the above-mentioned memory LSI of the present invention with a data compression/decompression function, at a time of data-read, the control section is to directly receive data read out from the memory section without having it go through the compression/decompression section, so as to output the data from the external input/output terminal. At a time of compressed data-read, on the other hand, the control section is to compress data read out from the memory section by the data compressor within the compression/decompression section, so as to output the compressed data from the external input/output terminal.

With respect to the above-mentioned memory LSI of the present invention with a data compression/decompression function, at a time of data-write, the control section is to directly write data received from the external input/output terminal on the memory section without having it go through the compression/decompression section. At a time of compressed data-write, on the other hand, the control section is to decompress the data received from the external input/output terminal by the data decompressor within the compression/decompression section, so as to have the data decompressed to become an original state and written on the memory section.

In respect of the above-mentioned memory LSI of the present invention with a data compression/decompression function, at a time of compressed data-read, the memory LSI is to output the compressed data after a lapse of compress-read-access delay time. The compress-read-access delay time is a sum of read-access delay time and a particular compression transaction delay time.

Concerning the above-mentioned memory LSI of the present invention with a data compression/decompression function, the memory LSI is to determine whether the access is the one having been passed through the compression/decompress ion section by the control section or not, according to a type of a given command or a given value of a memory address.

Regarding the above-mentioned memory LSI of the present invention with a data compression/decompression function, the memory LSI is to hold within the control section, different identifiers previously given to the memory section and the compression/decompression section, respectively. When a command for instructing access is given, the memory LSI with a data compression/decompression function is to determine whether the access is the one having been passed through the compression/decompression section by the control section or not, by identifying which one of the two identifiers is being designated within the given command.

In connection with the above-mentioned memory LSI of the present invention with a data compression/decompression function, the memory LSI is provided with two chip select terminals within the external input/output terminal. The memory LSI with a data compression/decompression function is to determine whether the access is the one having been passed through the compression/decompression section by the control section or not, by identifying which one of the two chip select terminals is being activated at a time of access.

In respect of the above-mentioned memory LSI of the present invention with a data compression/decompression function, the memory LSI is capable of directly inputting the compressed data outputted from the data compressor to the memory section, by which compress-rewrite-access is made possible. The compress-rewrite-access is an access in which the data being stored in an arbitrary position within the memory section is compressed within the chip so as to be rewritten on the memory section.

Regarding the above-mentioned memory LSI of the present invention with a data compression/decompression function, the memory LSI does not only designate a data-read address from the memory section but also designates a rewrite address as data in performing compress-rewrite-access. Moreover, the control section is to determine whether the compress-rewrite-access is an access to go through the compression/decompression section or not, following the same processes for access distinction described above.

According to the main memory system in respect to the second aspect of the present invention, the main memory system comprises an arbitrary number of memory LSIs and an arbitrary number of memory LSIs with a data compression/decompression function. The memory LSIs with a data compression/decompression function store data which is capable of bing compressed. Here, by using compress-read-access, compress-write-access and such with respect to transferring of compressible data, it is possible to reduce the amount of data transmission over the memory bus which accompanies processings of compressible data.

According to the main memory system with respect to the third aspect of the present invention, the main memory system comprises an arbitrary number of memory LSIs and an arbitrary number of data compression/decompression function added memory LSIs. The memory LSIs with a data compression/decompression function store graphics data. Here, using compress-read-access, compress-write-access and such with respect to transferring of graphics data, it is possible to reduce the amount of data transmission over the memory bus which accompanies processings of graphics data.

According to the graphics memory system with respect to the fourth aspect of the present invention, the graphics memory system comprises an arbitrary number of memory LSIs with a data compression/decompression function which are connected to the graphics controller. Here, in transferring graphics data between the memory LSIs with a data compression/decompression function and the graphics controller, the graphics memory system is capable of reducing the amount of data transmission with the use of compress-read-access, compress-write-access and such.

According to the memory LSI of the present invention with a data compression/decompression function, at a time of data-read to the outside, the memory LSI with a data compression/decompression function is to compress data being read out from the memory section by the data compressor within the compression/decompression section, so as to output the compressed data through the external input/output terminal. On the other hand, at a time of data-write from the outside, the memory LSI with a data compression/decompress ion function is to decompress the compressed data inputted from the external input/output terminal by the data decompressor within the compression/decompression section, so as to write the data decompressed to an original state on the memory section. Therefore, it is possible to perform data transferring through the external input/output terminal and memory bus connected to the external input/output terminal, having the data in a compressed state.

According to the main memory system using the memory LSI with a data compression/decompression function, a plurality of memory LSIs with a data compression/decompression function and a plurality of conventional memory LSIs are connected to a single memory bus. Therefore, by mapping such data having consistency and redundancy like for instance, graphics data etc., to the memory LSI with a data compression/decompression function, at a time of processing with the use of such data, it is possible to reduce the amount of data transmission over the memory bus.

Therefore, in accordance with the present invention, it is possible to perform data compression with an effective use of redundancy and consistency of data, not only in certain predetermined access patterns but also in other access patterns in more general terms. This means that there is less dependency on the expansion of data bandwidth relying upon high-speed performances of the external interface and the memory bus of the memory LSI, and that now data traffic itself can be reduced by data compression.

The above and further objects and the novel feature of the invention will more fully appear from the following detailed description when the same is read in connection with the accompanying drawings. It is to be expressly understood, however, that the drawings are for illustration only and are not intended as a definition of the limits of the invention.

BRIEF DESCRIPTION OF THE DRAWINGS

FIG. 2 is a block diagram showing a first embodiment of a memory LSI of the present invention with a data cmpression/decompression function;

FIG. 4A is a timing chart showing operational timing of the memory LSI with a compression/decompression function at a time of read-access;

FIG. 4B is a timing chart showing operational timing of the memory LSI with a compression/decompression function at a time of compress-read-access;

FIG. 4C is a timing chart showing operational timing of the memory LSI with a compression/decompression function at a time of write-access;

FIG. 4D is a timing chart showing operational timing of the memory LSI with a compression/decompression function at a time of compress-write-access;

FIG. 5A is a diagram illustrating a first example of a mechanism for identifying an access object between a memory section and a data compression/decompression section of the memory LSI with a compression/decompression function;

FIG. 5B is a diagram illustrating a second example of the mechanism for identifying the access object between the memory section and the data compression/decompression section of the memory LSI with a compression/decompression function;

FIG. 5C is a diagram illustrating a third example of the mechanism for identifying the access object between the memory section and the data compression/decompression section of the memory LSI with a compression/decompression function;

FIG. 8 is a block diagram showing one exemplary structure of a graphics memory system using the memory LSI with a data compression/decompression function shown in FIG. 2 and 6;

DESCRIPTION OF THE PREFERRED EMBODIMENTS

Figure 1:
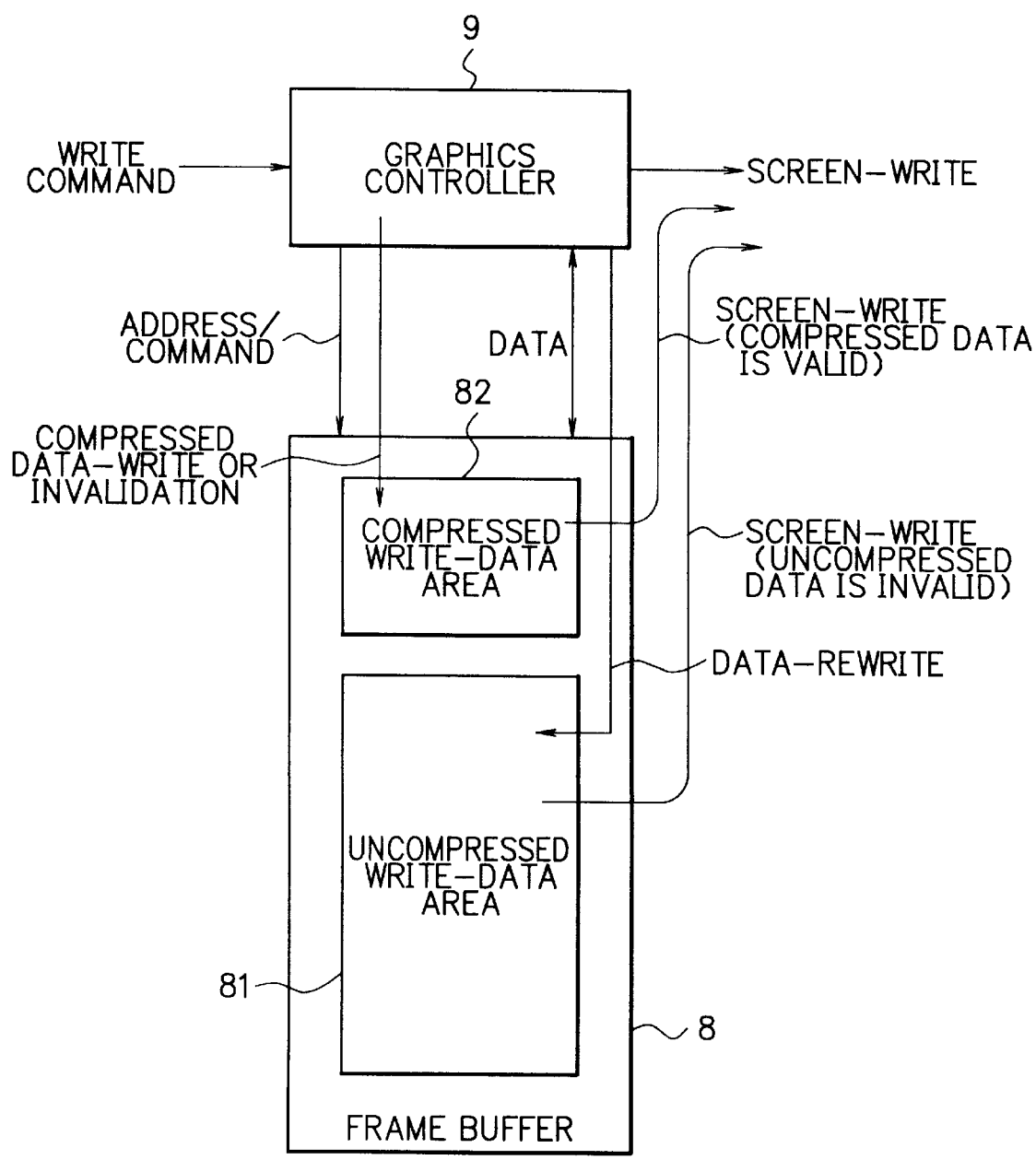
FIG. 1 is an explanatory diagram illustrating a structure of a graphics memory system using a conventional data compression technique.

Referring now to the drawings, a description of preferred embodiments of the present invention will be given in detail.

FIG. 2 is a block diagram showing a first embodiment of a memory LSI of the present invention, having a data compression/decompression function. In FIG. 2, the memory LSI 1 with a data compression/decompression function comprises an external input/output terminal 20, a control section 11, a memory section 12, a compression/decompression section 13, and selectors 16 and 17.

The external input/output terminal 20 is formed by a command/address input terminal 201 and a data input/output terminal 202. The compression/decompression section 13 is formed by a data compressor 14 and a data decompressor 15.

The command/address input terminal 201 is a terminal for designating a command indicating the type of access and for indicating an address to be accessed with respect to the memory LSI with a data compression/decompression function. Here, there are four types of accesses including a read-access, compress-read-access, write-access, and compress-write-access.

The data input/output terminal 202 is a terminal which gives data to be written at a time of write-access or compress-write-access. It is also a terminal which outputs data read out at a time of read-access or compress-read-access.

The controller 11 is arranged to determine the operation within the chip in accordance with the input from the command/address input terminal 201, and to generate control signals such as instruction signals for compression/decompression, control signals for read/write transactions, etc.. The memory LSI 1 with a data compression/decompression function is capable of performing the above four types of accesses with respect to data of any region within the memory section 12.

Figure 3A:
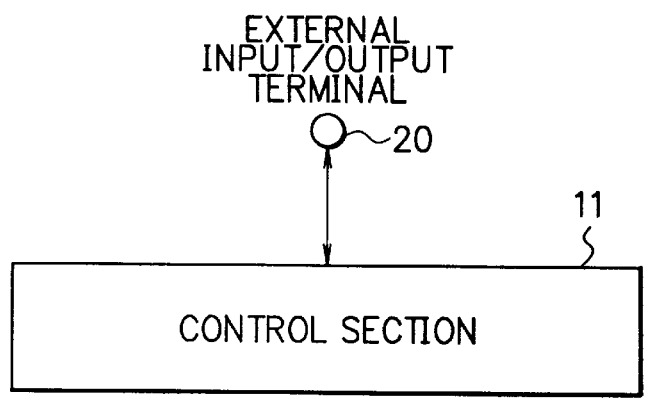
FIG. 3A is a block diagram showing a first example of an external input/output terminal of the memory LSI of the present invention.
Figure 3B:
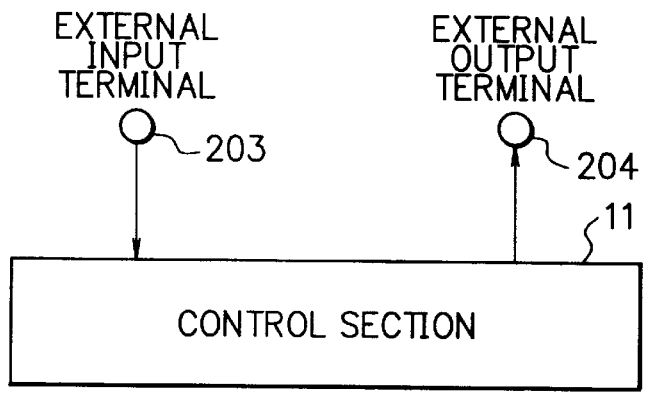
FIG. 3B is a block diagram showing a second example of the external input/output terminal of the memory LSI of the present invention.
Figure 3C:
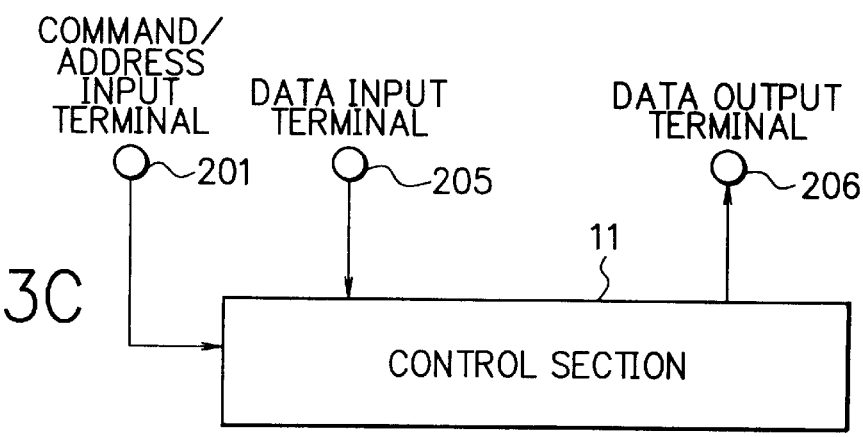
FIG. 3C is a block diagram showing a third example of the external input/output terminal of the memory LSI of the present invention.

FIGS. 3A, 3B and 3C show three examples of the external input/output terminal of the memory LSI 1 of the present invention with a data compression/decompression function. The external input/output terminal 20 of the prior art shown in FIG. 2, for example, is recognized in a Synchronous DRAM, SyncLink DRAM etc. of the conventional memory LSI. The Synchronous DRAM is a type of DRAM which performs data input/output in synchronism with a clock signal inputted from the outside. As to the SyncLink DRAM, it is mentioned in "New DRAM Technologies—A Comprehensive Analysis of the New Architectures (Second Edition)" (Steven A. Przybylski, MicroDesign Resources, 1996, pp. 320–336).

In FIG. 3A, the external input/output terminal 20 is not separated. This type of structure is noted in the Rambus DRAM of the conventional memory LSI. Here, the Rambus DRAM is a DRAM using the Rambus technique, which is described earlier as a prior art.

In FIG. 3B, there are an external input terminal 203 and external output terminal 204 serving together as the external input/output terminal. This type of structure is recognized, for example, in a RamLink DRAM of the conventional memory LSI. The RamLink DRAM is mentioned in "New DRAM Technologies—A Comprehensive Analysis of the New Architectures (Second Edition)" (Steven A. Przybylski, MicroDesign Resources, 1996, pp. 306–319).

In FIG. 3C, there are a command/address input terminal 201, data input terminal 205, and data output terminal 206 serving together as the external input/output terminal.

FIGS. 4A to 4D are timing charts showing the operation of the memory LSI 1 having data compression/decompression function shown in FIG. 2. Here, FIGS. 4A to 4D show operational timing of the memory LSI 1 when it is constructed on the basis of the conventional Synchronous DRAM, and when its data input/output is being observed from the outside.

First, referring to FIG. 4A, a command a1 for instructing read transaction is given in read-access. Then after a lapse of a predetermined cycle, data ① to ④ being read out over a number of cycles will be outputted together. When referring to FIG. 2 in this case, the controller 11 is to instruct data-read to the memory section 12, after which the read data is inputted directly to the selector 16 without passing through the data compressor 14, so as to be passed on to the controller 11 and then to the data input/output terminal 202 from which it is outputted to the outside.

Second, referring to FIG. 4B, in compress-read-access, a command b1 for instructing compressed data-read is given. Then after a lapse of a predetermined cycle, data ① and ② being read out over a number of cycles will be outputted together. When referring to FIG. 2 in this case, the controller 11 is to instruct data-read to the memory section 12 by which data is read out from the memory section 12. Then the read data is compressed by the data compressor 14 and then inputted to the selector 16 so as to be passed on to the controller 11 and then to the data input/output terminal 202 from which it is outputted.

Here, for the data to be outputted from the data input/output terminal 202 to the outside has to go through compression process, the amount of output data becomes comparatively smaller than the amount of data in the normal read-access. For the data has to go through compression process, the compress-read-access delay time till the point of data output is delayed from the normal read-access delay time by the compression process delay time.

Third, referring to FIG. 4C, in write-access, a command c1 for instructing write, and data ① to ④ to be written are given by the data input/output terminal 202 at the same time. When referring to FIG. 2 in this case, the controller 11 is to instruct the memory 12 for data-write, and directly input data given by the data input/output terminal 202 to the selector 17 without having it pass through the data decompressor 15. The data is then inputted to the memory section 12 where it is to be written.

Fourth, referring to FIG. 4D, in compress-write-access, a command d1 for instructing write, and data ① and ② to be written are given by the data input/output terminal 202 at the same time. When referring here to FIG. 2 in this case, the controller 11 is to instruct the decompressor 15 for data decompression, and the memory 12 for data-write, respectively. Accordingly, the data given by the data input/output terminal 202 to the data decompressor 15 is decompressed, and then passed on to the selector 17 and then to the memory 12 where it is to be written.

FIGS. 5A to 5C show examples of mechanism for identifying whether the access target is the memory section 12 or the compression/decompression section 13. Here, the memory section 12 becomes the access target at a time of read-access or write-access. On the other hand, the compression/decompression section 13 becomes the access target at a time of compress-read-access or compress-write-access.

According to FIG. 5A, a command or an address given by the command/address input terminal 201 is to indicate whether the access target is the memory section 12 or the compression/decompression section 13.

In case of giving instructions through commands, different commands are used for read, compress-read, write and compress-write transactions, respectively. Such commands are decoded by a decoder 111 to become proper instructions. On the other hand, in case of giving instructions through address, for example, the upper bits of the address are decoded by the decoder 111 in order to determine whether the access target is the memory section 12 or the compression/decompression section 13.

According to FIG. 5B, the control section 11 is provided with a memory identifier holding section 112 and a compressor/decompressor identifier holding section 113. The memory identifier holding section is holding an identifier relating to the memory section 12. The compressor/decompressor identifier holding section 113 is holding an identifier relating to the compression/decompression section 13. When a command requesting for an access is given, comparators 114 and 115 are to detect which identifier is being designated by the command, so as to determine whether the access target is the memory section 12 or the compression/decompression section 13.

As to the conventional Rambus DRAM, SyncLink DRAM, RamLink DRAM etc., a particular DRAM to be accessed is instructed through designating an identifier within the command corresponding to that particular DRAM.

Again, according to FIG. 5B, the memory section 12 and the compression/decompression section 13 are capable of being distinguished according to the conventional mechanism, i. e. by having the memory section 12 and the compression/decompression section 13 provided with different identifiers, respectively.

Regarding the structure of the external input/output terminal, the mechanism illustrated in FIG. 5B is being applied to the structure shown in FIG. 3A. The same mechanism can also be applied to any of the other structures shown in FIGS. 2, 3B, and 3C.

If the identifier within the command does not correspond to either of the identifiers kept in the memory identifier holding section 112 and the compressor/decompressor identifier holding section 113, this means that the command is not a proper command for instructing access to the memory LSI 1 with a data compression/decompression function.

According to FIG. 5C, two chip select terminals 2011 and 2012 are provided to serve as the command/address input terminal 201. It will be determined by the decoder 116 whether the access target is the memory section 12 or the compression/decompression section 13 depending on which of the two chip select terminals is being activated.

Figure 6:
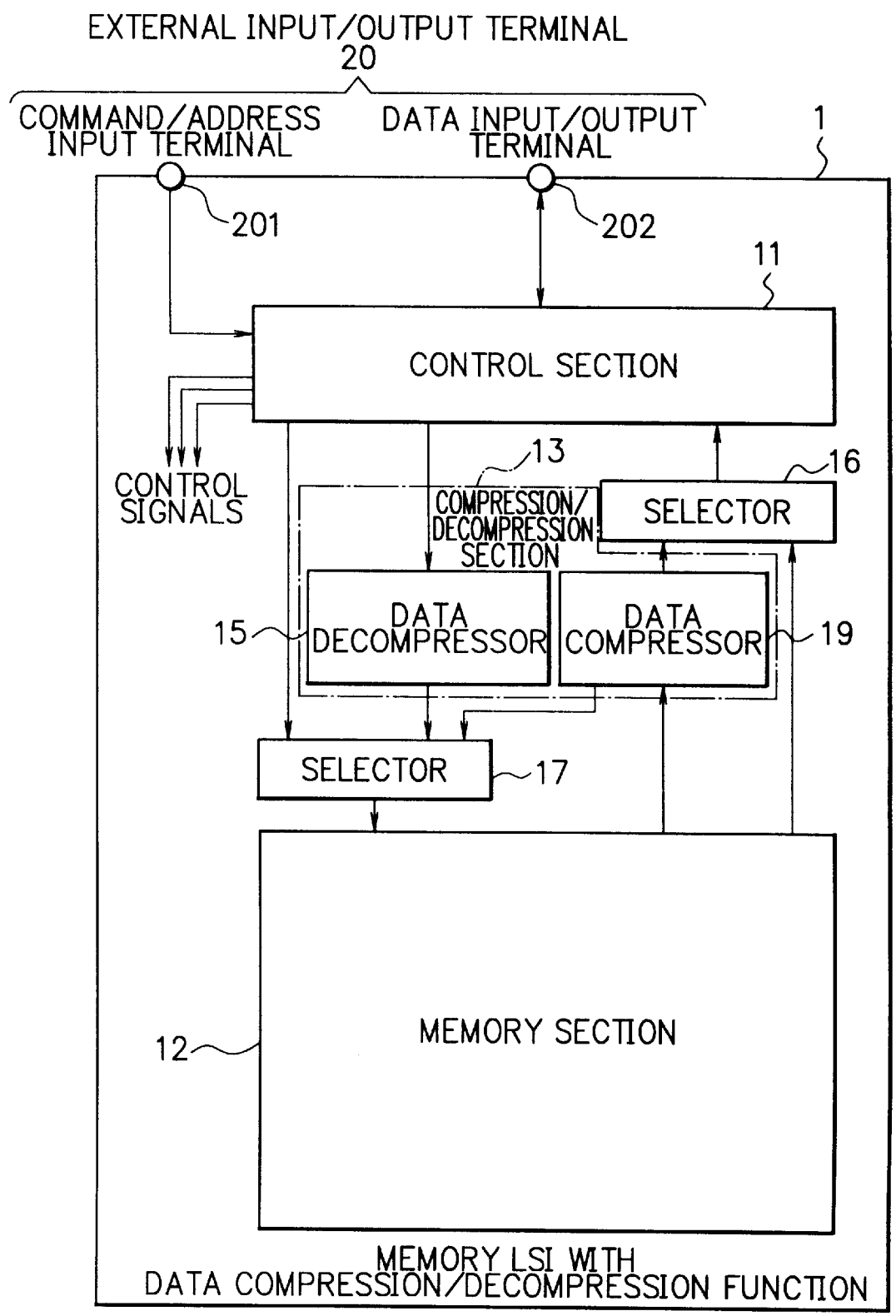
FIG. 6 is a diagram illustrating a second embodiment of the memory LSI of the present invention with a data compression/decompression function.

FIG. 6 is a block diagram illustrating a second embodiment of a memory LSI of the present invention with a data compression/decompression function. Same reference numerals are given to corresponding constituents between the memory LSI 1 of FIG. 6 and that of FIG. 2. Moreover, those sets of same constituents are supposed to operate in the same way.

The only difference between the previous embodiment shown in FIG. 2 and the present embodiment shown in FIG. 6 is the data compressor. That is, a data compressor 19 in the present embodiment is connected to the selector 17, while the data compressor 14 in the earlier embodiment is not. Therefore, in accordance with the present embodiment, the output from the data compressor 19 can be transferred to the memory section 12 through the selector 17. Owing to this, the memory LSI 1 of FIG. 6 is capable of performing compress-rewrite-access which was not available in the first embodiment.

The compress-rewrite-access is a kind of access in which data being read out from the memory section 12 is compressed by the data compressor 19, after which it is rewritten again on the memory section 12. In performing compress-rewrite-access, it has to be determined through one of the mechanisms explained with reference to FIGS. 5A to 5C, that the requested access is meant for the compression/decompression section 13.

Like the commands for requesting write-access and compress-write-access, a command for requesting compress-rewrite-access also accompanies data input to the external input/output terminal 20. In this case, the data inputted to the external input/output terminal 20 is used in designating the address of the memory section 12 where data-rewrite is performed.

Figure 7:
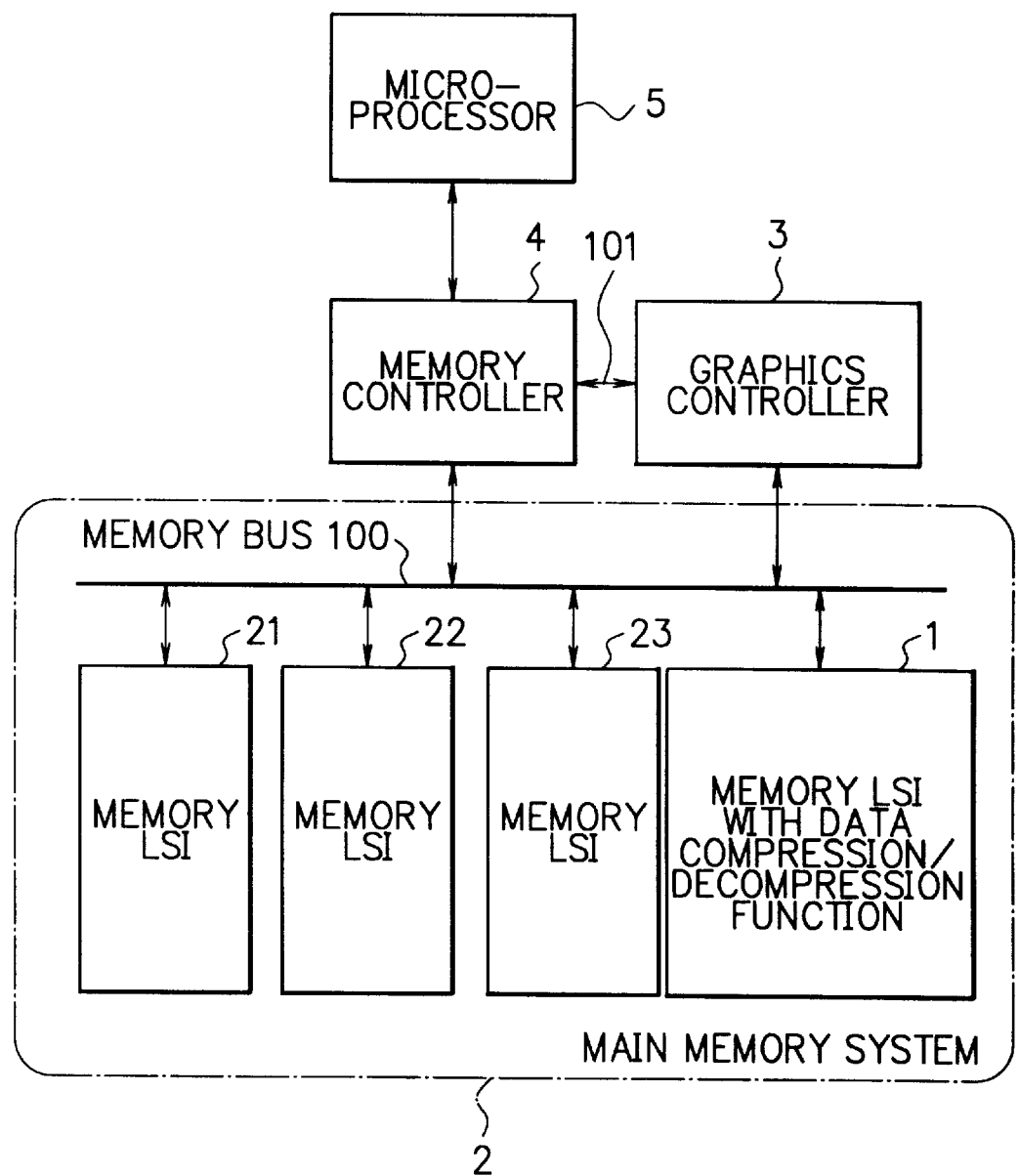
FIG. 7 is a block diagram showing one exemplary structure of a main memory system using the memory LSI with a data compression/decompression function shown in FIG. 2 and 6.

FIG. 7 is a block diagram illustrating the structure of a main memory system applying the memory LSI with a data compression/decompression function shown in FIG. 2 and FIG. 6. A main memory system 2 shown in the figure is based on the idea of Unified Memory Architecture (UMA). UMA is defined by a technique for arranging the graphics system, especially the frame buffer within the main memory. The goal is to reduce the number of memory LSIs by allocating a portion of the main memory for the frame buffer.

Referring to FIG. 7, within the main memory system 2, there is a memory bus 100 having connected a plurality of memory LSIs 21 to 23, and a single memory LSI 1 with a data compression/decompression function. It is also possible to have a plurality of memory LSIs with a data compression/decompression function connected to the memory bus 100.

Further, the memory bus 100 within the main memory system 2 is connected to a memory controller 4 and a graphics controller 3. The memory controller 4 and the graphics controller 3 are to perform an occupation arrangement of the memory bus 100 through an occupation arrangement line 101.

According to the main memory system 2, a graphics memory to be accessed by the graphics controller 3 is mapped to the memory LSI 1 with a data compression/decompression function, which leads to a reduction of data transmission at a time of graphics transaction.

FIG. 8 is a block diagram showing a graphics memory system applying the memory LSI with a data compression/decompression function illustrated in FIGS. 2 and 6. The graphics memory system 6 comprises two memory LSIs 1-1 and 1-2 with a compression/decompression function. The amount of data transmission over the memory bus 102 can be reduced by having the graphics controller 7 and the graphics memory system 6 mutually exchange compressed graphics data.

Like this, in respect of the main memory system shown in FIG. 7 and the graphics memory system shown in FIG. 8, data to be carried over the memory bus 100 or 102 can be compressed by the data compression transaction performed within the memory LSI 1, or 1-1 and 1-2 with a data compression/decompression function. Consequently, even when the memory bus bandwidth is the same as that of the conventional memory LSI, more data transmission is made available. This means that practically, larger bandwidth is made possible in use.

The attempt to improve the memory bus bandwidth by high-speed performance is facing some difficulties concerning the electrical design of the memory LSI. However, arranging the memory LSI(s) with a data compression/decompression function in the above manner can provide another means for facilitating high-bandwidth.

As for personal computers etc., transactions most needing the memory bus data bandwidth is the graphics transactions mainly including 3D graphics transactions. However, as the graphics data is highly consistent and redundant, by using the memory LSI 1, or 1-1 and 1-2 with a data compression/decompression function as a memory for storing the graphics data, the amount of data can be reduced to about a half to $\frac{1}{10}$ owing to compression transaction within the memory LSI with a data compression/decompression function.

As for the memory system such as the previously mentioned main memory system 2 and graphics memory system 6 using the memory LSIs 1, 1-1 and 1-2 with a data compression/decompression function, there are some advantages noted as compared with the conventional memory system which performs data compression by a software or hardware outside the memory LSI. Such advantages are explained in the following.

First, data compression and decompression transactions are conducted within the memory LSI 1, 1-1 and 1-2 with a data compression/decompression function, being closed. Hence, an overhead, i.e. reading out data once from the memory LSI to the outside to compress the data and to have it written back again, does not happen.

Second, the data is stored as its original state, and compressed only at a time of data transferring, by which random access to an arbitrary data becomes possible. With respect to the conventional technique, however, the data is stored as being compressed. Therefore, it is impossible to perform random access, or even in case where random access is possible, it is only with a support by a table look-up, which is practically an overhead.

Third, in connection with the previously mentioned advantages, as compared with the conventional case where the data compression technique is considered as only applicable in compressing write data from the frame buffer at a time of screen-write, the above-mentioned memory system using the memory LSI with a data compression/decompression function is applicable in data transferring for graphics processing, for example in screen-rewrite and Z-buffer access, and in reading texture data. This contributes to reducing the amount of data transmission.

Fourth, in connection with the advantages mentioned above, in addition to the graphics data, the memory system using the memory LSI with a data compression/decompression function can also compress data having redundancy and consistency, for example, audio data, text data, computer program, vector data for scientific technical calculations etc.. This is suggesting that the data bandwidth can be practically improved in use.

Finally, in addition to the above structures, the one which substantiates compress-rewrite-access is capable of performing the same kind of data compression as in the conventional case, such data compression being carried out independently within the memory LSI (1, 1-1, 1-2) with a data compression/decompression function.

Besides the above-described applications, the memory LSI of the present invention with a compression/decompression function can be applied in the following structures. The description will be given on two structures of main memory systems and a structure of a graphics memory system.

One example of the main memory system applying the memory LSI with a data compression/decompression function includes a memory LSI with a data compression/decompression function and a memory chip. The memory LSI with a data compression/decompression function of the main memory system is provided at least with an external input/output terminal for data input or output, a memory for storing data, a control means for controlling data-read and data-write with respect to the memory, a first selector (a first transfer means) for transfering data read out from the memory directly to the external input/output terminal at a time of data-read, a second selector (a second transfer means) for transfering data inputted from the external input/output terminal directly to the memory at a time of data-write, a compressor for compressing data read out from the memory so as to transfer the compressed data to the external input/output terminal at a time of compressed data-read, and a decompressor for decompressing the compressed data inputted from the external input/output terminal so as to transfer the decompressed data to the memory at a time of compressed data-write. All of the above constituents are included in the same chip. The memory chip being one of the constituents of the main memory system is storing at least a program.

With respect to the above main memory system, the first selector may select between data read out from the memory and data compressed by the compressor in response to data-read and compressed data-read, so as to transfer the selected one of the data to the external input/output terminal.

With respect to the above main memory system, the second selector may select between data inputted from the external input/output terminal and data decompressed by the decompressor in response to data-write and compressed data-write, so as to transfer the selected one of the data to the memory.

With respect to the above main memory system, the controller may control data-read, data-write, compressed data-read, and compressed data-write with respect to the memory, according to a command inputted from the external input/output terminal.

Given the above condition, the controller may comprise a holding section for holding a first identifier previously given to the memory and a second identifier different from the first identifier which is previously given to the compressor and to the decompressor, and a discriminating section for distinguishing which one of the two identifiers is being designated by a command inputted from the outside. Then the controller is to control data-read, data-write, compressed data-read, and compressed data-write with respect to the memory, according to a result from the discriminating section.

With respect to the above main memory system, the controller may have a function to control data-read, data-write, compressed data-read, and compressed data-write with respect to the memory, according to a memory address inputted from the external input/output terminal.

With respect to the above main memory system, the external input/output terminal may take a form where it comprises a first chip select terminal where a signal for selecting the memory is inputted at a time of access to the memory, and a second chip select terminal where a signal for selecting the compressor or decompressor is inputted at a time of access to the memory.

Given the above condition, the controller may control data-read, data-write, compressed data-read, and compressed data-write with respect to the memory, according to the result suggesting which one of the two chip select terminals is being provided with the signal at a time of access to the memory.

With respect to the above main memory system, the controller may write data being once read out from the memory back to the memory after it is being compressed by the compressor at a time of compressed data-rewrite.

With respect to the above main memory system, the controller may compress data being once read out from the memory by the compressor according to an address inputted from the external input/output terminal, so as to write the compressed data on the memory according to the address inputted from the input/output terminal as data, at a time of compressed data-rewrite.

Another example of the main memory system applying the memory LSI with a data compression/decompression function includes a memory LSI with a data compression/decompression function and a memory chip. The memory LSI with a data compression/decompression function of the main memory system is storing graphics data and provided at least with an external input/output terminal for data input or output, a memory for storing data, a control means for controlling data-read and data-write with respect to the memory, a first selector (a first transfer means) for transfering data read out from the memory directly to the external input/output terminal at a time of data-read, a second selector (a second transfer means) for transfering data inputted from the external input/output terminal directly to the memory at a time of data-write, a compressor for compressing data read out from the memory so as to transfer the compressed data to the external input/output terminal at a time of compressed data-read, and a decompressor for decompressing the compressed data inputted from the external input/output terminal so as to transfer the decompressed data to the memory at a time of compressed data-write. All of the above constituents are included in the same chip. The memory chip being one of the constituents of the main memory system is storing at least a program.

Regarding the above main memory system, the first selector may select between data read out from the memory and data compressed by the compressor in response to data-read and compressed data-read with respect to the memory, so as to transfer the selected one of the data to the external input/output terminal.

Regarding the above main memory system, the second selector may select between data inputted from the external input/output terminal and data decompressed by the decompressor in response to data-write and compressed data-write with respect to the memory, so as to transfer the selected one of the data to the memory.

Regarding the above main memory system, the controller may control data-read, data-write, compressed data-read, and compressed data-write with respect to the memory, according to a command inputted from the external input/output terminal.

Given the above condition, the controller may comprise a holding section for holding a first identifier previously given to the memory and a second identifier different from the first identifier which is previously given to the compressor and the decompressor, and a discriminating section for distinguishing which one of the two identifiers is being designated by a command inputted from the outside. Then the controller is to control data-read, data-write, compressed data-read, and compressed data-write with respect to the memory, according to a result from the discriminating section.

Regarding the above main memory system, the controller may have a function to control data-read, data-write, compressed data-read, and compressed data-write with respect to the memory, according to a memory address inputted from the external input/output terminal.

Regarding the above main memory system, the external input/output terminal may take a form where it comprises a first chip select terminal where a signal for selecting the memory is inputted at a time of access to the memory, and a second chip select terminal where a signal for selecting the compressor or decompressor is inputted at a time of access to the memory.

Given the above condition, the controller may control data-read, data-write, compressed data-read, and compressed data-write with respect to the memory, according to the result suggesting which one of the two chip select terminals is being provided with the signal at a time of access to the memory.

Regarding the above main memory system, the controller may write data being once read out from the memory back to the memory after it is being compressed by the compressor at a time of compressed data-rewrite.

Regarding the above main memory system, the controller may compress data being once read out from the memory by the compressor according to an address inputted from the external input/output terminal, so as to write the compressed data on the memory according to the address inputted from the input/output terminal as data, at a time of compressed data-rewrite.

One example of the graphics memory system applying the memory LSI with a data compression/decompression function includes a memory LSI with a data compression/decompression function and a graphics controller. The memory LSI with a data compression/decompression function of the graphics memory system is storing graphics data and provided at least with an external input/output terminal for data input or output, a memory for storing data, a control means for controlling data-read and data-write with respect to the memory, a first selector (a first transfer means) for transfering data read out from the memory directly to the external input/output terminal at a time of data-read, a second selector (a second transfer means) for transfering data inputted from the external input/output terminal directly to the memory at a time of data-write, a compressor for compressing data read out from the memory so as to transfer the compressed data to the external input/output terminal at a time of compressed data-read, and a decompressor for decompressing the compressed data inputted from the external input/output terminal so as to transfer the decompressed data to the memory at a time of compressed data-write. All of the above constituents are included in the same chip. The graphics controller being one of the constituents of the graphics memory system transfers the graphics data between the memory integrated circuit and itself, and performs at least compression and decompression transactions on the graphics data.

Concerning the above graphics memory system, the first selector may select between data read out from the memory and data compressed by the compressor in response to data-read and compressed data-read with respect to the memory, so as to transfer the selected one of the data to the external input/output terminal.

Concerning the above graphics memory system, the second selector may select between data inputted from the external input/output terminal and data decompressed by the decompressor in response to data-write and compressed data-write with respect to the memory, so as to transfer the selected one of the data to the memory.

Concerning the above graphics memory system, the controller may control data-read, data-write, compressed data-read, and compressed data-write with respect to the memory, according to a command inputted from the external input/output terminal.

Given the above condition, the controller may comprise a holding section for holding a first identifier previously given to the memory and a second identifier different from the first identifier which is previously given to the compressor and to the decompressor, and a discriminating section for distinguishing which one of the two identifiers is being designated by a command inputted from the outside. Then the controller is to control data-read, data-write, compressed data-read, and compressed data-write with respect to the memory, according to a result from the discriminating section.

Concerning the above graphics memory system, the controller may have a function to control data-read, data-write, compressed data-read, and compressed data-write with respect to the memory, according to a memory address inputted from the external input/output terminal.

Concerning the above graphics memory system, the external input/output terminal may take a form where it comprises a first chip select terminal where a signal for selecting the memory is inputted at a time of access to the memory, and a second chip select terminal where a signal for selecting the compressor or decompressor is inputted at a time of access to the memory.

Given the above condition, the controller may control data-read, data-write, compressed data-read, and compressed data-write with respect to the memory, according to the result suggesting which one of the two chip select terminals is being provided with the signal at a time of access to the memory.

Concerning the above graphics memory system, the controller may write data being once read out from the memory back to the memory after it is being compressed by the compressor at a time of compressed data-rewrite.

Concerning the above graphics memory system, the controller may compress data being once read out from the memory by the compressor according to an address inputted from the external input/output terminal, so as to write the compressed data on the memory according to the address inputted from the input/output terminal as data, at a time of compressed data-rewrite.

As described above, according to the present invention, the memory integrated circuit comprises at least an external input/output terminal for inputting and outputting data, a memory for storing data, and a controller for controling data-read and data-write with respect to the memory. The external input/output terminal, the memory and the controller are all included within the same chip. This chip of the memory integrated circuit is further provided with a first selector for directly transferring data read out from the memory to the external input/output terminal at a time of data-read, a second selector for directly transferring data inputted from the external input/output terminal to the memory at a time of data-write, a data compressor for compressing data read out from the memory so as to transfer the compressed data to the external input/output terminal at a time of compressed data-read, and a data decompressor for decompressing the compressed data inputted from the external input/output terminal so as to transfer the data decompressed to the original state to the memory at a time of compressed data-write. Owing to such structure, it is possible to practically expand the data bandwidth in use in an easier manner with higher reliability, which leads to an advantage of reducing the amount of data transmission.

While preferred embodiments of the invention have been described using specific terms, such description is for illustrative purposes only, and it is to be understood that changes and variations may be made without departing from the spirit or the scope of the following claims.

What is claimed is:

1. A memory integrated circuit provided at least with an external input/output terminal for data input or output, a memory for storing data, and a control means for controlling data-read and data-write with respect to the memory, the external input/output terminal, the memory, and the control means being included in the same chip, comprising:
    a first transfer means for transferring data read out from the memory directly to the external input/output terminal at a time of data-read;
    a second transfer means for transferring data inputted from the external input/output terminal directly to the memory at a time of data-write;
    a compression means for compressing data read out from the memory so as to transfer the compressed data to the external input/output terminal at a time of compressed data-read; and
    a decompression means for decompressing the compressed data inputted from the external input/output terminal so as to transfer the decompressed data to the memory at a time of compressed data-write,
    the first transfer means, the second transfer means, the compression means, and the decompression means being included in the same chip.

2. A memory integrated circuit according to claim 1, wherein:
    the first transfer means selects between data read out from the memory and data compressed by the compressing means in response to data-read and compressed data-read with respect to the memory, so as to transfer the selected one of the data to the external input/output terminal.

3. A memory integrated circuit according to claim 1, wherein:
    the second transfer means selects between data inputted from the external input/output terminal and data decompressed by the decompression means in response to data-write and compressed data-write, so as to transfer the selected one of the data to the memory.

4. A memory integrated circuit according to claim 2, wherein:
    the second transfer means selects between data inputted from the external input/output terminal and data decompressed by the decompression means in response to data-write and compressed data-write, so as to transfer the selected one of the data to the memory.

5. A memory integrated circuit according to claim 1, wherein:
    the control means controls data-read, data-write, compressed data-read, and compressed data-write, with respect to the memory, according to a command inputted from the external input/output terminal.

6. A memory integrated circuit according to claim 2, wherein:
    the control means controls data-read, data-write, compressed data-read, and compressed data-write, with respect to the memory, according to a command inputted from the external input/output terminal.

7. A memory integrated circuit according to claim 3, wherein:
    the control means controls data-read, data-write, compressed data-read, and compressed data-write, with respect to the memory, according to a command inputted from the external input/output terminal.

8. A memory integrated circuit according to claim 1, wherein:
    the control means controls data-read, data-write, compressed data-read, and compressed data-write with respect to the memory, according to a memory address inputted from the external input/output terminal.

9. A memory integrated circuit according to claim 2, wherein:
    the control means controls data-read, data-write, compressed data-read, and compressed data-write with respect to the memory, according to a memory address inputted from the external input/output terminal.

10. A memory integrated circuit according to claim 3, wherein:
    the control means controls data-read, data-write, compressed data-read, and compressed data-write with respect to the memory, according to a memory address inputted from the external input/output terminal.

11. A memory integrated circuit provided at least with an external input/output terminal for data input or output, a memory for storing data, and a control means for controlling data-read and data-write with respect to the memory, the external input/output terminal, the memory, and the control means being included on the same chip, comprising:
    a first transfer means for transferring data read out from the memory directly to the external input/output terminal at a time of data-read;

a second transfer means for transferring data inputted from the external input/output terminal directly to the memory at a time of data-write;

a compression means for compressing data read out from the memory so as to transfer the compressed data to the external input/output terminal at a time of compressed data-read; and a decompression means for decompressing the compressed data inputted from the external input/output terminal so as to transfer the decompressed data to the memory at a time of compressed data-write, the first transfer means, the second transfer means, the compression means, and the decompression means being included in the same chip, the control means comprising a holding means for holding a first identifier previously given to the memory and a second identifier different from the first identifier which is previously given to the compression means and the decompression means, and a discriminating means for distinguishing which one of the two identifiers is being designated by a command inputted from outside, the control means controlling data-read, data-write, compressed data-read, and compressed data-write with respect to the memory according to a result from the discriminating means.

12. A memory integrated circuit according to claim 1, wherein:

the external input/output terminal comprises a first chip select terminal where a signal for selecting the memory is inputted at a time of access to the memory, and a second chip select terminal where a signal for selecting the compression means or decompression means is inputted at a time of access to the memory; and the control means controls data-read, data-write, compressed data-read, and compressed data-write with respect to the memory, according to the result suggesting which one of the two chip select terminals is being provided with the signal at a time of access to the memory.

13. A memory integrated circuit according to claim 2, wherein:

the external input/output terminal comprises a first chip select terminal where a signal for selecting the memory is inputted at a time of access to the memory, and a second chip select terminal where a signal for selecting the compression means or decompression means is inputted at a time of access to the memory; and the control means controls data-read, data-write, compressed data-read, and compressed data-write with respect to the memory, according to the result suggesting which one of the two chip select terminals is being provided with the signal at a time of access to the memory.

14. A memory integrated circuit according to claim 3, wherein:

the external input/output terminal comprises a first chip select terminal where a signal for selecting the memory is inputted at a time of access to the memory, and a second chip select terminal where a signal for selecting the compression means or decompression means is inputted at a time of access to the memory; and the control means controls data-read, data-write, compressed data-read, and compressed data-write with respect to the memory, according to the result suggesting which one of the two chip select terminals is being provided with the signal at a time of access to the memory.

15. A memory integrated circuit provided at least with an external input/output terminal for data input or output, a memory for storing data, and a control means for controlling data-read and data-write with respect to the memory, the external input/output terminal, the memory, and the control means being included on the same chip, comprising:

a first transfer means for transferring data read out from the memory directly to the external input/output terminal at a time of data-read;

a second transfer means for transferring data inputted from the external input/output terminal directly to the memory at a time of data-write;

a compression means for compressing data read out from the memory so as to transfer the compressed data to the external input/output terminal at a time of compressed data-read; and a decompression means for decompressing the compressed data inputted from the external input/output terminal so as to transfer the decompressed data to the memory at a time of compressed data-write, the first transfer means, the second transfer means, the compression means, and the decompression means being included in the same chip, wherein:

the control means is to write data being once read out from the memory back to the memory after it is compressed by the compression means at a time of compressed data-rewrite.

16. A memory integrated circuit provided at least with an external input/output terminal for data input or output, a memory for storing data, and a control means for controlling data-read and data-write with respect to the memory, the external input/output terminal, the memory, and the control means being included on the same chip, comprising:

a first transfer means for transferring data read out from the memory directly to the external input/output terminal at a time of data-read;

a second transfer means for transferring data inputted from the external input/output terminal directly to the memory at a time of data-write;

a compression means for compressing data read out from the memory so as to transfer the compressed data to the external input/output terminal at a time of compressed data-read; and a decompression means for decompressing the compressed data inputted from the external input/output terminal so as to transfer the decompressed data to the memory at a time of compressed data-write, the first transfer means, the second transfer means, the compression means, and the decompression means being included in the same chip, wherein:

the control means is to compress data being once read out from the memory by the compression means according to an address inputted from the external input/output terminal so as to write the compressed data on the memory according to the address inputted from the external input/output terminal as data at a time of compressed data-rewrite.

17. A main memory system including a memory integrated circuit and a memory chip:

the memory integrated circuit provided at least with an external input/output terminal for data input or output, a memory for storing data, a control means for controlling data-read and data-write with respect to the memory, a first transfer means for transferring data read out from the memory directly to the external input/ output terminal at a time of data-read, a second transfer means for transferring data inputted from the external input/output terminal directly to the memory at a time of data-write, a compression means for compressing data read out from the memory so as to transfer the compressed data to the external input/output terminal at a time of compressed data-read, and a decompression means for decompressing the compressed data inputted from the external input/output terminal so as to transfer the decompressed data to the memory at a time of compressed data-write, all of which being included in the same chip; and the memory chip storing at least a program.

18. A main memory system including a memory integrated circuit and a memory chip:

the memory integrated circuit storing graphics data and provided at least with an external input/output terminal for data input or output, a memory for storing data, a control means for controlling data-read and data-write with respect to the memory, a first transfer means for transferring data read out from the memory directly to the external input/output terminal at a time of data-read, a second transfer means for transferring data inputted from the external input/output terminal directly to the memory at a time of data-write, a compression means for compressing data read out from the memory so as to transfer the compressed data to the external input/output terminal at a time of compressed data-read, and a decompression means for decompressing the compressed data inputted from the external input/output terminal so as to transfer the decompressed data to the memory at a time of compressed data-write, all of which being included in the same chip; and the memory chip storing at least a program.

19. A graphics memory system including a memory integrated circuit and a graphics controller:

the memory integrated circuit storing graphics data and provided at least with an external input/output terminal for data input or output, a memory for storing data, a control means for controlling data-read and data-write with respect to the memory, a first transfer means for transferring data read out from the memory directly to the external input/output terminal at a time of data-read, a second transfer means for transferring data inputted from the external input/output terminal directly to the memory at a time of data-write, a compression means for compressing data read out from the memory so as to transfer the compressed data to the external input/output terminal at a time of compressed data-read, and a decompression means for decompressing the compressed data inputted from the external input/output terminal so as to transfer the decompressed data to the memory at a time of compressed data-write, all of which being included in the same chip; and the graphics controller transferring the graphics data between the memory integrated circuit and itself, performing at least compression and decompression transactions of the graphics data.

* * * * *